United States Patent [19]

Ang et al.

[11] Patent Number: 5,457,716
[45] Date of Patent: Oct. 10, 1995

[54] AUTOMATIC FREQUENCY CONTROL IN A RADIO COMMUNICATION RECEIVER

[75] Inventors: Yi M. G. G. Ang; Cheng H. Ho, both of Singapore, Singapore

[73] Assignee: Motorola, Inc., Schaumburg, Ill.

[21] Appl. No.: 188,981

[22] Filed: Jan. 31, 1994

[51] Int. Cl.$^6$ .................................................. H04L 27/06
[52] U.S. Cl. ........................ 375/344; 375/358; 455/182.2
[58] Field of Search ................................. 375/97, 81, 78, 375/90, 88, 114, 89, 75, 94, 39, 344, 336, 334, 335, 316, 327, 368, 326, 365, 343; 329/300, 302; 455/255–260, 182.2; 331/1 R; 340/825.44, 825.2, 825.52, 825.21, 825.58

[56] References Cited

U.S. PATENT DOCUMENTS

| | | | |
|---|---|---|---|
| 4,570,125 | 2/1986 | Gibson | 375/81 |
| 4,621,366 | 11/1986 | Cain et al. | 375/106 |
| 4,823,123 | 4/1989 | Siwiak | 340/825.44 |
| 4,947,409 | 8/1990 | Raith et al. | 375/97 |
| 5,109,544 | 4/1992 | Mittel et al. | 155/182.2 |
| 5,157,694 | 10/1992 | Iwasaki et al. | 375/81 |
| 5,239,306 | 8/1993 | Siwiak et al. | 340/825.44 |
| 5,276,706 | 1/1994 | Critchlow | 375/97 |

Primary Examiner—Stephen Chin
Assistant Examiner—Tesfalaet Bocure
Attorney, Agent, or Firm—James A. Lamb

[57] ABSTRACT

A selective call radio frequency (RF) communication device (105) includes a receiver (203) for receiving and converting an RF signal into a converted signal. A controller (206) generates binary message information, a synchronization command signal and an address detection signal. An alert device (207) indicates the receipt of the message information. A frequency counter (427) measures the frequency of the converted signal and also determines the associated binary state of the binary message information. A measurement memory (439) stores the converted signal frequency measurements. The frequency control generator (440) generates a frequency control signal in response to the synchronization command signal being generated. The frequency control signal is a function of the stored converted signal frequency measurements and the associated binary states. The controllable local oscillator (215) supplies a local oscillator signal to the receiver, the local oscillator signal having a frequency controlled by the frequency control signal.

19 Claims, 6 Drawing Sheets

AUTOMATIC FREQUENCY CONTROL IN A RADIO COMMUNICATION RECEIVER

FIELD OF THE INVENTION

This invention relates in general to automatic frequency control in radio communication receivers, and in particular to automatic frequency control in radio communication receivers used in digital communication systems.

BACKGROUND OF THE INVENTION

A known technique of automatic frequency control for superheterodyne radio receivers designed for receiving binary digital signals, which has been used successfully, is to measure the frequency of a converted signal in the receiver, the converted signal being a signal generated by a mixing operation performed in the receiver which converts the frequency of a modulated RF carrier to a modulated signal at a lower, intermediate frequency (IF). In this approach, the modulated IF signal is measured for a plurality of bit periods, and an average IF frequency is determined from the frequency measurements. This is then used to modify the mixing operation by controlling a local oscillator frequency, which improves the receive sensitivity.

A different technique of automatic frequency control is known for use in zero IF quadrature receivers. This technique is most appropriate for receiving frequency modulation signals having low deviation-to-bitrate ratios, such as Minimal Shift Keying (MSK) and Gaussian Frequency Shift Keying (GFSK). In this technique, time durations between the bit transitions and clock transitions of the quadrature signals and a nominal time are used as a basis for controlling the local oscillator to improve the receive sensitivity. While this technique is appropriate for MSK and GFSK, it requires many calculations per bit period in systems using frequency modulation techniques having higher deviation-to-bit-rate ratios, thus causing the use of higher speed, more costly processors or logic to accomplish the improvement.

The techniques described above are typically enabled within the receiver only when a sufficiently strong signal is available, in order to prevent random corrections from occurring when no signal is being received. This has been previously accomplished by enabling and disabling the automatic frequency control by means of a signal strength indication generated within the receiver, or by the use of a selective call address to enable the automatic frequency control when the signal being received is intended for the radio receiver.

While this has worked satisfactorily, it can result in the automatic frequency control being disabled for long periods of time while a signal is being received which happens not to be intended for the radio receiver, even though an intended signal will be received from the same source, and can result in corrections occurring during the receipt of a signal which are of sufficient magnitude to induce errors which otherwise would not be induced.

Thus, what is needed is a simple, low cost, means of automatic frequency control well suited for portable radio communication receivers.

SUMMARY OF THE INVENTION

Accordingly, in a first aspect of the present invention, an automatic frequency control method is for use in a radio frequency (RF) communication device which processes a received, frequency modulated (FM) RF signal having binary message information including at least a synchronizing portion. The radio frequency (RF) communication device includes a receiver, a demodulator, and a local oscillator having a controllable output frequency controlled by a frequency control signal for providing reference signals for converting the received RF signal to a converted signal.

The automatic frequency control method includes the steps of converting the received RF signal into the converted signal, demodulating the converted signal to generate the binary message information represented by binary states, and recovering, from the converted signal, a bit clock indicating bit periods within the binary message information. The automatic frequency control method further includes the steps of generating a synchronization command signal when the synchronization portion of the binary message information correlates to a predetermined synchronization pattern, measuring the frequency of the converted signal and further determining the associated binary state of the binary message information, for each of a plurality of bit periods, and modifying the frequency control signal in response to the synchronization command signal being generated, the frequency control signal generated being a first function of the measured converted frequencies and the associated binary states.

Accordingly, in a second aspect of the present invention, a radio frequency (RF) communication device includes a receiver, a demodulator, a bit clock generator, a synchronization correlator, a frequency counter, a measurement memory, a frequency control generator, and a controllable local oscillator. The (RF) communication device is for processing a received, frequency modulated (FM) RF signal having binary message information, the binary message information comprising at least a synchronizing portion.

The receiver receives the RF signal and converts the received RF signal into a converted signal. The demodulator, coupled to the receiver, generates the binary message information represented by binary states. The bit clock generator generates a bit clock indicating bit periods within the binary information. The synchronization correlator, coupled to the receiver, generates a synchronization command signal when the synchronization portion of the binary information correlates to a predetermined synchronization pattern. The frequency counter, coupled to the receiver, measures the frequency of the converted signal and further determines the associated binary state of the binary message information for each of a plurality of bit periods. The measurement memory stores the converted signal frequency measurements. The frequency control generator, coupled to the measurement memory and the synchronization correlator, generates a frequency control signal in response to the synchronization command signal being generated, the frequency control signal generated being a function of the stored converted signal frequency measurements and the associated binary states. The controllable local oscillator, coupled to the frequency control generator and to the receiver, supplies a local oscillator signal to the receiver, the local oscillator signal having a frequency being controlled by the frequency control signal.

Accordingly, in a third aspect of the present invention, a selective call radio frequency (RF) communication device includes a receiver, a controller, an alert device, a frequency counter, a measurement memory, a frequency control generator, and a controllable local oscillator. The (RF) communication device is for processing a received, frequency modulated (FM) RF signal having binary message information, the binary message information including at least a synchronizing portion, an address portion, and a message portion.

The receiver receives and converts the RF signal into a converted signal, the receiver being a zero intermediate frequency (IF) quadrature receiver. The converted signal comprises two orthogonal zero IF channel signals.

The controller, which is coupled to the receiver, includes an address memory, a demodulator, a bit clock generator, a synchronization correlator, and an address detector. The address memory stores a predetermined address. The demodulator is coupled to the receiver for generating the binary message information, represented by binary states. The bit clock generator, which is coupled to the demodulator, generates a bit clock indicating the bit periods of the binary message information. The synchronization correlators, which is coupled to said receiver, generates a synchronization command signal when the synchronization portion of the binary message information correlates to a predetermined synchronization pattern. The address detector, which is coupled to said demodulator, generates an address detection signal when the address portion of the binary message information matches a predetermined address.

The alert device indicates the receipt of the message in response to the address being detected. The frequency counter, which is coupled to the receiver, measures the frequency of the converted signal and also determines the associated binary state of the binary message information for each of a plurality of bit periods. The measurement memory, which is coupled to said frequency counter, stores the converted signal frequency measurements. The frequency control generator, which is coupled to the measurement memory and the synchronization correlator, generates a frequency control signal in response to the synchronization command signal being generated, the frequency control signal generated being a function of the stored converted signal frequency measurements and the associated binary states. The controllable local oscillator, which is coupled to the frequency control generator and to the receiver, supplies a local oscillator signal to the receiver, the local oscillator signal having a frequency controlled by the frequency control signal.

DETAILED DESCRIPTION OF THE INVENTION

Figure 1:
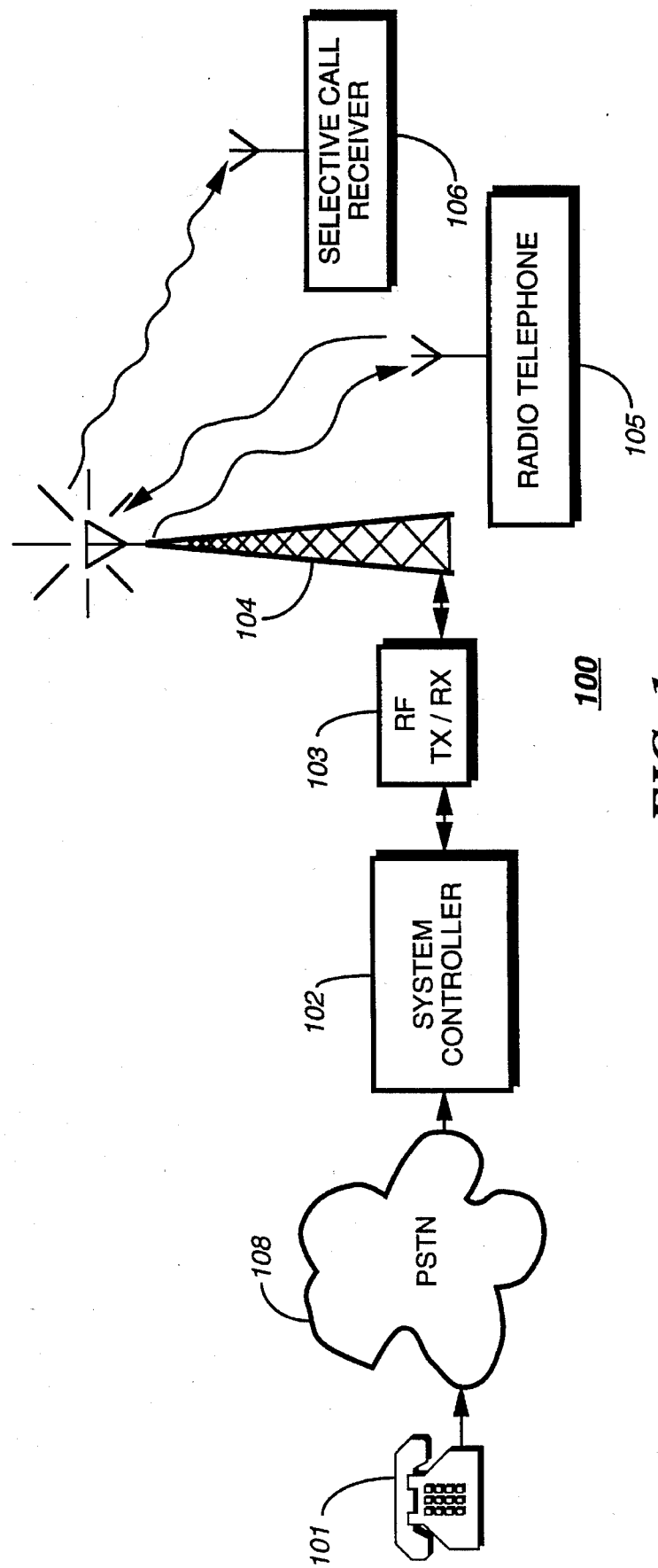
FIG. 1 shows an electrical block diagram of a radio communication system 100 in accordance with the preferred embodiment of the present invention.

Referring to FIG. 1, an electrical block diagram of a radio communication system is shown in accordance with the preferred embodiment of the present invention. The radio communication system 100 comprises a message input device, such as a telephone 101, connected by a conventional public switched telephone network (PSTN) 108 to a system controller 102. The system controller 102 oversees the operation of a radio frequency transmitter/receiver 103 and encodes and decodes inbound and outbound telephone addresses into formats that are compatible with land line message switch computers and personal radio telephone addressing requirements, such as cellular message protocols. The system controller 102 can also function to encode paging messages for transmission by the radio frequency transmitter/receiver 103. Telephony signals and data messages are transmitted from and received by at least one antenna 104 coupled to the radio frequency transmitter/receiver 103. The telephony signals are transmitted to and received from a personal radio telephone 105. The radio frequency transmitter/receiver 103 may also be used to transmit data paging messages to an optional portable receiving device 106.

It should be noted that the system controller 102 is capable of operating in a distributed transmission control environment that allows mixing cellular, simulcast, master/slave, or other coverage schemes for providing reliable radio signals within a geographic area. Moreover, as one of ordinary skill in the art would recognize, the telephonic and paging functions may reside in separate system controllers that operate either independently or in a networked fashion.

Figure 2:
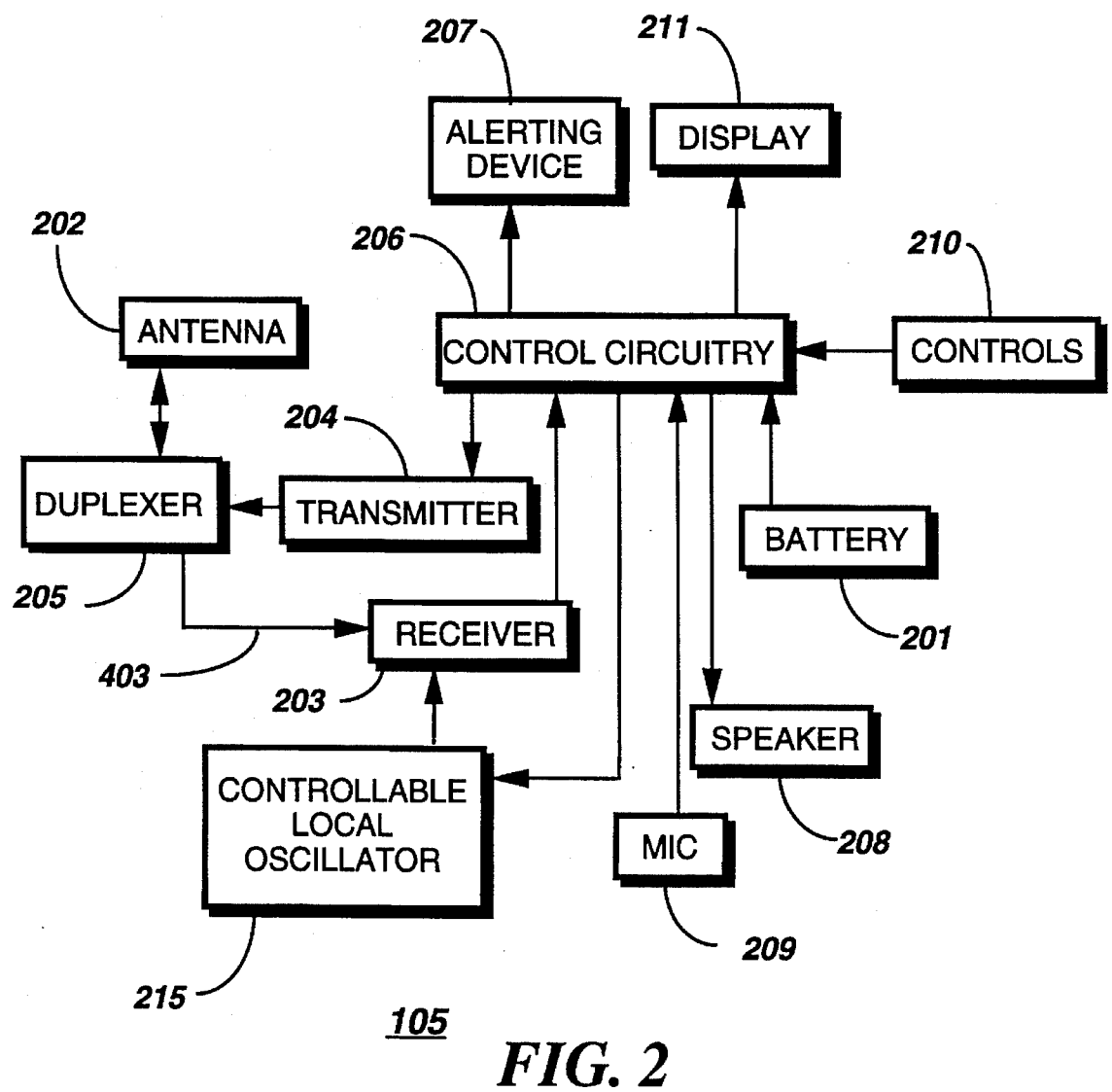
FIG. 2 shows an electrical block diagram of a personal radio telephone 105, for use in the radio communication system 100 of FIG. 1, in accordance with a preferred embodiment of the present invention.

Referring to FIG. 2, an electrical block diagram is shown of the personal radio telephone 105 powered by a battery 201, in accordance with a preferred embodiment of the present invention. A radio frequency (RF) signal having a carrier frequency is received and transmitted by an antenna 202. The antenna is coupled to a receiver 203 and a transmitter 204 by a duplexer 205. A received signal 403 is filtered, the frequency of the signal is converted, and the signal is demodulated by the receiver 203 in a manner well known in the art. The demodulated signal is coupled from the receiver 203 to a control circuit 206 comprising control logic for filtering the demodulated signal and recovering information contained within the received signal. In accordance with the preferred embodiment of the present invention, the control circuit 206 also comprises a frequency correction means which is coupled to a controllable local oscillator 215 for controlling a reference frequency used to generate a local oscillator signal 216 which is coupled to the receiver 203. The local oscillator signal 216 is used by the receiver 203 for the frequency conversion of the received signal 403. The recovered information is used by the control circuit 206 to activate an alert 207 (a ringer in the case of a cellular radio telephone), and after answering the call, to sustain a telephone connection. When the demodulated signal includes data information, the control circuit 206 presents the information on a display 211, such as a liquid crystal display. When the telephone connection is completed, the user audibly communicates with another party via a speaker 208 and a microphone 209. The control circuit 206 routes recovered audio to the speaker 208 which converts electrical energy into acoustical energy thus enabling the user to hear any communications. The microphone 209 is used to convert acoustic energy into electrical energy for use by the control circuit 206 in modulating the radio frequency carrier produced by the transmitter 204.

The user initiates a call by activating a proper control from a set of controls 210 and entering a number of a party to be contacted. When entering and sending a number, the number may be presented on the display 211 to provide the user with visual feedback confirming the number entered and subsequently sent.

The control circuit 206 also controls power modes of the personal radio telephone 105, comprising a low power mode, during which the receiver 203 is substantially unpowered and information cannot be received, and during which other portions of the personal radio telephone 105, including but not limited to the control circuit 206, are also substantially unpowered. During a normal power mode the receiver 203 and control circuit 206 are powered, messages are received and also acknowledged, and phone calls are placed. A timing function, for scheduling a return to the normal power mode, is maintained by the control circuit 206 during the low power mode. Such power mode control provides a battery saving feature such as is well known to one of ordinary skill in the art.

Figure 3:
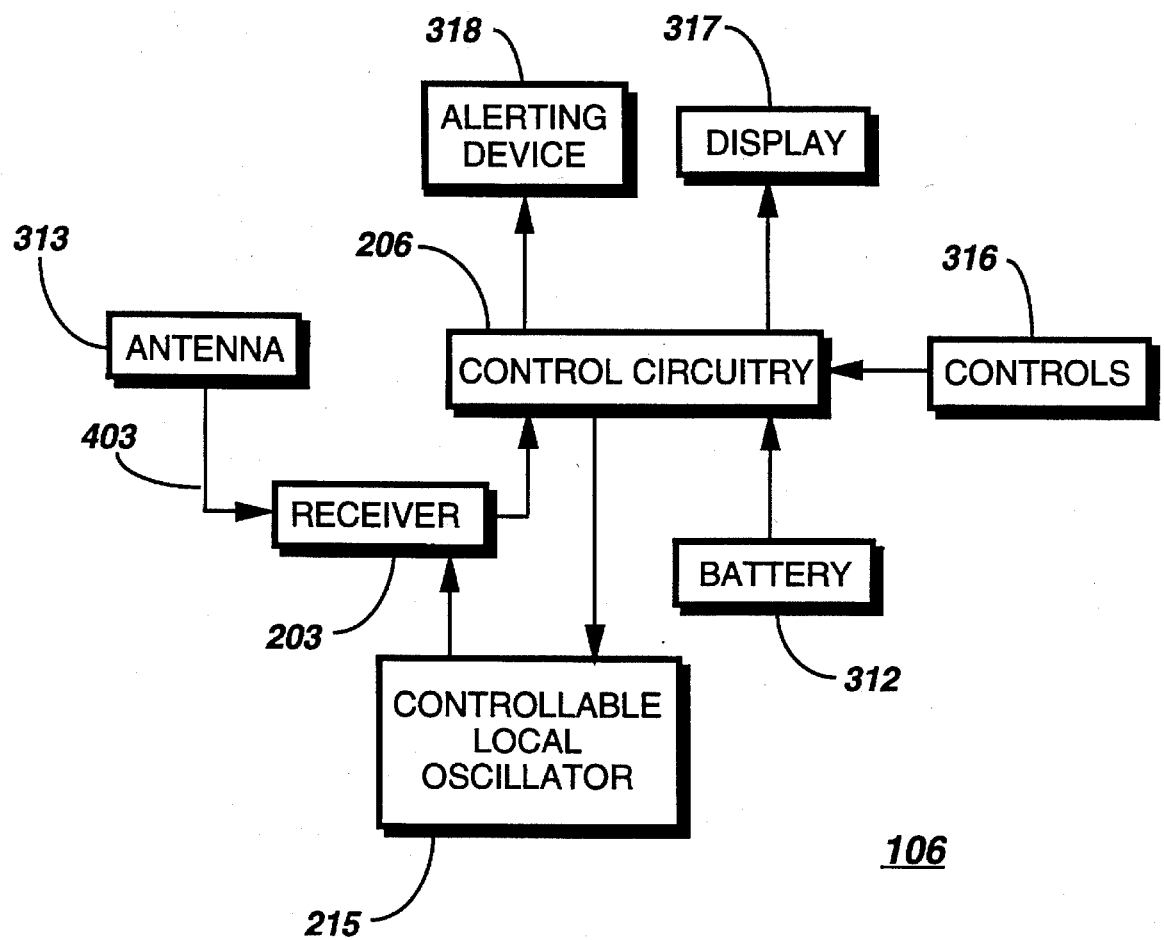
FIG. 3 shows an electrical block diagram of a portable receiving device 106, for use in the radio communication system 100 of FIG. 1, in accordance with a preferred embodiment of the present invention.

Referring to FIG. 3, an electrical block diagram is shown of the portable receiving device 106 powered by a battery 312, in accordance with a preferred embodiment of the present invention. The portable receiving device 106 operates to receive radio signals 403 via an antenna 313. The receiver 203 operates to filter, convert, and demodulate a received signal using conventional techniques and couples the demodulated signal to a control circuit 206, comprising control logic for decoding and recovering paging messages contained within the signal, in a manner well known in the art. In accordance with the preferred embodiment of the present invention, the control circuit 206 also comprises a frequency correction means which is coupled to a controllable local oscillator 215 for controlling a reference frequency used to generate a local oscillator signal 216 which is coupled to the receiver 203. The local oscillator signal 216 is used by the receiver 203 for the frequency conversion of the received signal 403. As determined by the contents of the recovered paging message and the settings of user controls 316, the portable receiving device 106 may present at least a portion of the paging message, using a display 317, such as a liquid crystal display, and may also signal the user via a sensible alerting device 318 that a message has been received. The paging message can include such as numeric and alphanumeric data messages.

The control circuit 206 also controls power modes of the portable receiving device 106, comprising a low power mode, during which the receiver 203 is substantially unpowered and information cannot be received, and other portions of the portable receiving device 106, including but not limited to the control circuit 206, are substantially unpowered. During a normal power mode the receiver 203 and control circuit 206 are powered to receive, process, annunciate, and display messages. A timing function, for scheduling a return to the normal power mode, is maintained by the control circuit 206 during the low power mode. Such power mode control provides a battery saving feature such as is well known to one of ordinary skill in the art.

In both the personal radio telephone 105 and the portable receiving device 106, it will be appreciated that the control circuit 206 may comprise a microprocessor and application specific integrated circuits that implement functions such as a signal processor (e.g., a filter and decoder), a conventional signal multiplexer, and a voltage regulator that may supply a regulated voltage to other portions of the radio. Alternatively, the associated control circuit 206 may include circuits such as digital logic, analog to digital converters, digital to analog converters, programmable input-output ports, a control bus, environmental sensing circuitry such as for light or temperature conditions, audio power amplifier circuitry, control interface circuitry, a clock or local oscillator frequency synthesizer, and display illumination circuitry. These elements are typically conventionally assembled to provide well known features offered in the personal radio telephone 105 or portable receiving device 106 desired by customers.

In the following description, the term portable device will be used to refer to the personal radio telephone 105 or portable receiving device 106 described above.

Figure 4:
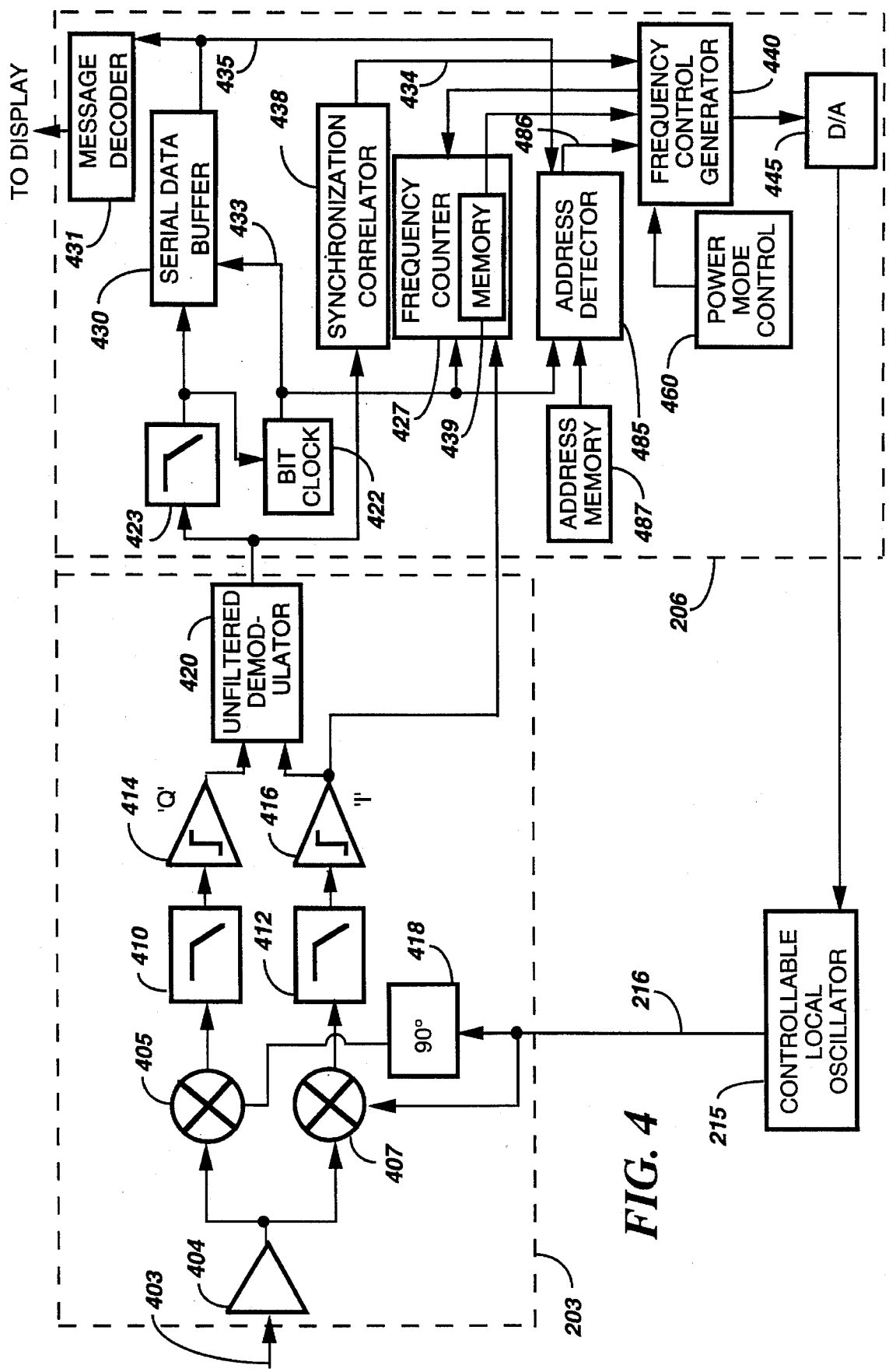
FIG. 4 shows an electrical block diagram of a receiver, portions of a control circuit, and a controllable local oscillator for use in the personal radiotelephone and the portable receiving devices of FIG. 2, and FIG. 3, in accordance with a preferred embodiment of the present invention.

Referring to FIG. 4, an electrical block diagram of the receiver 203, portions of the control circuit 206, and the controllable local oscillator 215 used in the personal radio telephone 105 and the portable receiving device 106 of FIG. 1, FIG. 2, and FIG. 3, are shown in accordance with a preferred embodiment of the present invention. The received signal 403 is coupled to the input of an RF amplifier 404, which amplifies and filters the received signal 403 to remove undesired out of band energy, and which generates an amplified signal which is coupled to a first input of a quadrature ("Q") channel mixer 405 and a first input of an in-phase ("I") mixer 407. A second input of the I channel mixer 407 is coupled to an output of the controllable local oscillator 215, which is generated by a voltage controlled oscillator (not shown), the frequency of which is approximately equal to the frequency of the received signal 403. A second input of the Q channel mixer 405 is also coupled to the output of the controllable local oscillator 215, but through a 90 degrees phase shift network 418. The outputs of mixers 405 and 407, which have the RF carrier frequency substantially removed, are coupled to low pass filters 410 and 412 which filter out undesirable RF components of the converted signal. Outputs of the filters 410 and 412 are coupled to limiters 414 and 416, which generate digital I and Q quadrature channel signals, each being a signal having two states. The I and Q channel signals are coupled from the limiters 414 and 416 to an unfiltered demodulator 420, which generates an unfiltered serial data signal which is coupled to a synchronization correlator 438 and a low pass filter 423. The low pass filter 423 provides a filtered serial data signal which is coupled from the output of the low pass filter 423 to a serial data buffer 430 and a bit clock circuit 422. The bit clock circuit 422 produces a bit clock signal 433 coupled to the serial data buffer 430, an address detector 485, and a frequency counter 427. The bit clock signal 433 is used by the serial data buffer 430 to generate a buffered data signal 435 which is synchronized to the bit clock signal 433.

The RF amplifier 404, the mixers 405 and 407, the 90 degrees phase shift network 418, and the filters 410 and 412, the limiters 414 and 416, and the unfiltered demodulator 420 are preferably part of an integrated circuit quadrature receiver, such as a UAA2080T manufactured by Signetics Company of Sunnyvale, Calif., but could alternatively be assembled using discrete RF transistors and passive elements, in a manner known to one of ordinary skill in the art. The low pass filter 423 is preferably implemented as an oversampling filter and a majority logic decoder, the serial data buffer 430 is a preferably a shift register, and the bit clock circuit 422 is a clock recovery circuit, which is implemented using logic, such as complementary metal oxide semiconductor (CMOS) circuits in a manner known to one of ordinary skill in the art.

The buffered data signal 435 is coupled to an input of an address detector 485. The buffered data signal 435 is further coupled to an input of message decoder 431 for other processing functions described above, such as to provide message display.

The synchronization correlator 438 generates a synchronization command signal 434, which is coupled to a first input of the frequency control generator 440. The synchronization command signal 434 is generated when the binary pattern of the unfiltered demodulated data correlates to a predetermined synchronization pattern with fewer than a predetermined number of errors. In the preferred embodiment of the present invention, the predetermined synchronization pattern is a 32 bit data word which includes a 31 bit psuedorandom sequence followed by one bit. This synchronization word is used in Post Office Code Standardization Advisory Group (POCSAG) paging system protocols, and provides a very reliable detection of the synchronization pattern. The I channel signal is coupled from the limiter 416 to a first input of the frequency counter 427. The frequency counter 427 counts the transitions of the I channel signal during each bit period (storing the count in a transition counter, not shown), determines a frequency measurement for the bit period from the transition count and a predetermined bit duration, and provides a frequency averaging function which updates a first or a second average frequency calculation. Each of the two average frequency calculations is an average of frequency measurements made during prior bit periods during which the binary state was one of two states (a first or second state, corresponding to a binary zero or one state). At the end of each current bit period, the average frequency calculation corresponding to the binary state during the current bit period is updated using the frequency measurement made in the current bit period, the last stored average frequency calculation associated with the state of the current bit period, and the number of calculations made for the state of the current bit period. As an example, if the bit period is 0.250 msec, and the number of transitions is 4, the frequency measurement is 16 Khz. If the first average frequency calculation is 14.1 KHz and the number of measurements is 13, then the new first average frequency calculation is (13*14.1 KHz+16 KHz)/14=14.2 KHz.

The frequency counter 427 stores each of the average frequency calculations, the binary state (a one or a zero) associated with each average frequency calculation, and the number of measurements used for determining each average frequency calculation, which have been derived by the frequency averaging means, in a frequency counter memory 439. The frequency counter memory 439 is coupled to a second input of the frequency control generator 440. A control input of the frequency counter 439 is connected to a first output of the frequency control generator 440.

A power mode control circuit 460 generates a power mode control signal coupled to a third input of the frequency control generator 440 as well as other circuits including, but not limited to the receiver 203. Only the coupling of the power mode control signal to the frequency control generator 440 is shown in FIG. 4. The power mode control signal has at least two states which correspond to the low power state and normal states described above with reference to FIG. 2 and FIG. 3. The address detector 485 generates an address detection signal 486 when a predetermined address portion of the buffered data signal 435, clocked into the address detector 485 by the bit clock signal 433, is matched by the address detector 485 to one of one or more predetermined selective call addresses. The one or more predetermined selective call addresses are stored in an address memory 487 which is coupled to the address detector 485. The address detection signal 486 is coupled to a fourth input of the frequency correction generator 440. Examples of selective call addresses stored in the address memory 487 are an individual address, a group address, and an all call address.

It will be appreciated that the Q channel signal can be coupled to the frequency counter 427, instead of the I channel signal, accomplishing the same results.

The synchronization correlator 438, the message decoder 431, the frequency counter 427, the frequency counter memory 439, the frequency control generator 440, and the address detector 485 are preferably implemented within portions of a microprocessor, such as a 68HC05 family processor manufactured by Motorola, Inc., of Schaumburg, Ill., including, but are not limited to those portions providing a program memory, a central processing unit, input/output registers, and a random access memory. The address memory 487 is preferably an electrically alterable random access memory (EAROM), but may also be implemented using read only memory (ROM), a random access memory (RAM), or other memory devices well known to one of ordinary skill in the art, and may also be implemented in a memory portion of a microprocessor.

In the preferred embodiment of the present invention the frequency control generator 440 controls the frequency counter 427, by the first output of the frequency control generator 440, to reset the first and second average frequency calculations and the associated first and second numbers of measurements stored in the frequency counter memory 439 to zero and to begin updating the two average frequency measurements and two numbers of calculations stored in the frequency counter memory 439. The frequency control generator then waits a predetermined period of time, for example, a time period equivalent to 100 bit periods, and reads the information stored in the frequency counter memory 439. The frequency control generator determines a best estimate of an average offset frequency (the average difference between the carrier frequency of the received signal and the local oscillator frequency) from one half the difference of the first and second average frequencies, with the sign of the best estimate of the offset determined by which average frequency is the greater. A digital correction signal, based on the best estimate of the average offset frequency, is generated by the frequency control generator 440 and coupled by a second output of the frequency control generator 440 to an input of a digital to analog converter 445. The digital to analog converter 445 converts the digital correction signal to an analog correction signal, which is coupled from an output of the digital to analog converter 445 to an input of the controllable local oscillator 215, altering the frequency of the local oscillator signal to substantially match the carrier frequency of the received signal. Substantially optimum frequency matching is thereby achieved between the I and Q channel, which keeps the demodulated binary waveforms very symmetrical, improving the receiving sensitivity of the portable device 105 or 106.

The frequency control generator 440 controls the frequency counter 427 to initiate frequency measurements and to generate a digital correction signal, at times determined from the input signals coupled from the synchronization correlator 438, the address detector 485, and the power mode control 460, as will be further described below.

The digital to analog converter 445 is preferably an

MC144110 CMOS integrated circuit manufactured by Motorola, Inc., of Schaumburg, Ill. The controllable local oscillator 215 is preferably a phase lock loop oscillator with a varactor controlled reference, well known to one of ordinary skill in the art.

It will be appreciated that the detection of the synchronization pattern is done very reliably, even when the synchronization pattern includes some errors, because the synchronization pattern is selected with such reliability as a performance criteria. Synchronization detection will therefore occur when there are offsets between the receive carrier frequency and local oscillator frequency that will prevent correct reception of portions of the receive signal other than the synchronization pattern, and the frequency control generator 440 will be enabled to correct the offset. It will be further appreciated that there are many different types of synchronization patterns used in other signaling protocols, which also have robust error protection and will also afford the necessary enabling of the frequency control generator 440.

It will also be appreciated that the frequency measurement of the I channel (or Q channel) in the zero IF quadrature receiver of the portable device 105 or 106 is a unique method of making a highly accurate determination of frequency offset between the receive carrier frequency and the local oscillator frequency. For example, when a reference oscillator for the microprocessor, which comprises the frequency counter 427, has an error of 100 parts per million, and the modulation frequencies for a binary one and a binary zero are 25 KHz, the first and second average frequency measurements made by the frequency counter 427 will have errors typically less than 25*10E3*100*10E-6 Hz=2.5 Hz, when a sufficient number of measurements are averaged. When the carrier frequency is, for example, 450MHz, the local oscillator frequency can be corrected to be within 2.5 Hz/(450*10E6 Hz)=0.0055 parts per million of the receive carrier frequency, which is far more accuracy than can be achieved by very expensive and large stabilized crystal references. Furthermore, for this example, the frequency at which the measurement is performed is 25 KHz, which is low enough to be well within the speed capabilities of the microprocessor used for the preferred embodiment of the present invention. As a comparison, in a superheterodyne receiver with a 455 KHz intermediate frequency, the frequency measurement, which is performed at 455KHz, loads the microprocessor approximately 18 times more (the ratio of 455 KHz to 25 KHz). The errors are typically less than 455*10E3*100*10E-6 Hz=45.5 Hz in this example.

It will be appreciated that the preferred embodiment of the present invention described above can be adapted for controlling the local oscillator frequency in superheterodyne receivers. The significant design changes (other than inherent differences between a superheterodyne receiver and a zero IF quadrature receiver), when the present invention is adapted for use in a superheterodyne receiver, are that an intermediate frequency (IF) signal is coupled to the input of the frequency counter 427 instead of an I or Q signal, and that the best estimate of the magnitude of an average offset between the frequency of the converted IF signal and a nominal IF frequency is determined by one half the difference of a first and second average deviation frequency. The nominal IF frequency is a frequency at which an intermediate frequency stage and a demodulator of the superheterodyne receiver are designed to perform most optimally. The first average deviation frequency is the difference of a first average frequency and the nominal IF frequency. The first average frequency is an average of the frequency measurements of the IF signal associated with first binary states. The second average deviation frequency is the difference of a second average frequency and the nominal IF frequency. The second average frequency is an average of the frequency measurements of the IF signal associated with second binary states. The binary state associated with the larger of two deviations determines the sign of the average offset frequency, which is used to determine the frequency control signal change.

As an example of the preferred embodiment of the present invention as used in a superheterodyne receiver, an IF frequency is 455 KHz, the first average frequency is 462 KHz, and the second average frequency is 452 KHz. The best estimate of the offset is determined to be ½*(452 KHz+462 Khz)−455 KHz=2 KHz, and the frequency change is negative.

In the preferred embodiment of the present invention, the correction signal is changed only when the portable device 105 or 106 is in the low power mode, to avoid inducing potential errors caused by an instantaneous frequency correction during the reception of as signal. An alternative means of avoiding the inducement of errors is to use a limit on the cumulative magnitude of changes of the correction signal within a predetermined time period. In some systems, the correction signal change can be alternatively or additionally controlled to occur only when one of the addresses of the portable device 105 or 106 is detected. This address control method is useful, for instance, in systems wherein a valid synchronization signal may be received from more than one system transmitter-each system transmitter having, of course, possibly different frequency offset errors which could cause continual and undesirable changes to the correction signal of the portable device 105 or 106.

Figure 5:
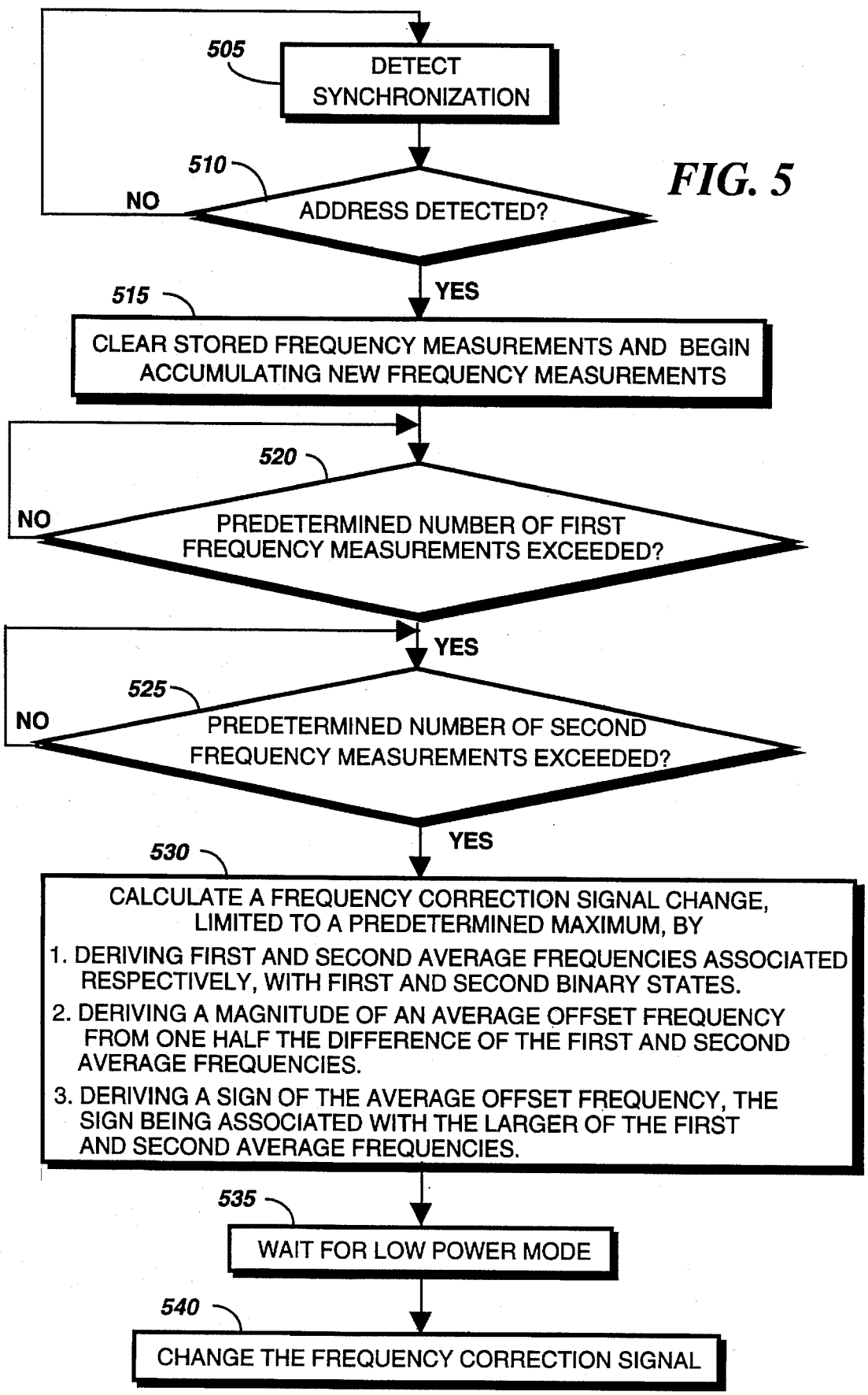
FIG. 5 shows a flow chart which illustrates a method of frequency offset correction (or automatic frequency control), for use in the personal radiotelephone and the portable receiving devices of FIG. 2, and FIG. 3, in accordance with a preferred embodiment of the present invention.

Referring to FIG. 5, a flow chart is shown which illustrates a method of frequency offset correction (or automatic frequency control), in accordance with a preferred embodiment of the present invention. At step 505, a received synchronization pattern is detected. When a selective call, group call, or all call address is not detected at step 510, after a predetermined time period has expired following the synchronization pattern detection, the process flow returns to step 505, awaiting another synchronization pattern detection. When a selective call, group call, or all call address is detected at step 510, prior to the expiration of the predetermined time period following the synchronization detection, average frequency measurements, and measurement counts currently stored in the frequency counter memory 439 are cleared, and the accumulation of new average frequency measurements is begun. The method for making average frequency measurements will be described below, with reference to FIG. 6. When the number of frequency measurements made for the first average frequency exceeds a predetermined number, such as 50 in this example, at step 520, and the number of frequency measurements made for the second average frequency exceeds a predetermined number, such as 50 in this example, at step 525, a frequency control signal change is determined from the difference of the first and second average frequencies and the binary state associated with the larger of the two averages, as described above. When the number of frequency measurements made for the first average frequency does not exceed the predetermined number at step 520, the process flow remains at step 520. When the number of frequency measurements made for the first average frequency does not exceed the predetermined number at step 525, the process flow remains at step 525. When a low power mode is attained at step 535, the frequency control signal change determined at step 530 is used to change the frequency control signal at step 540.

Figure 6:
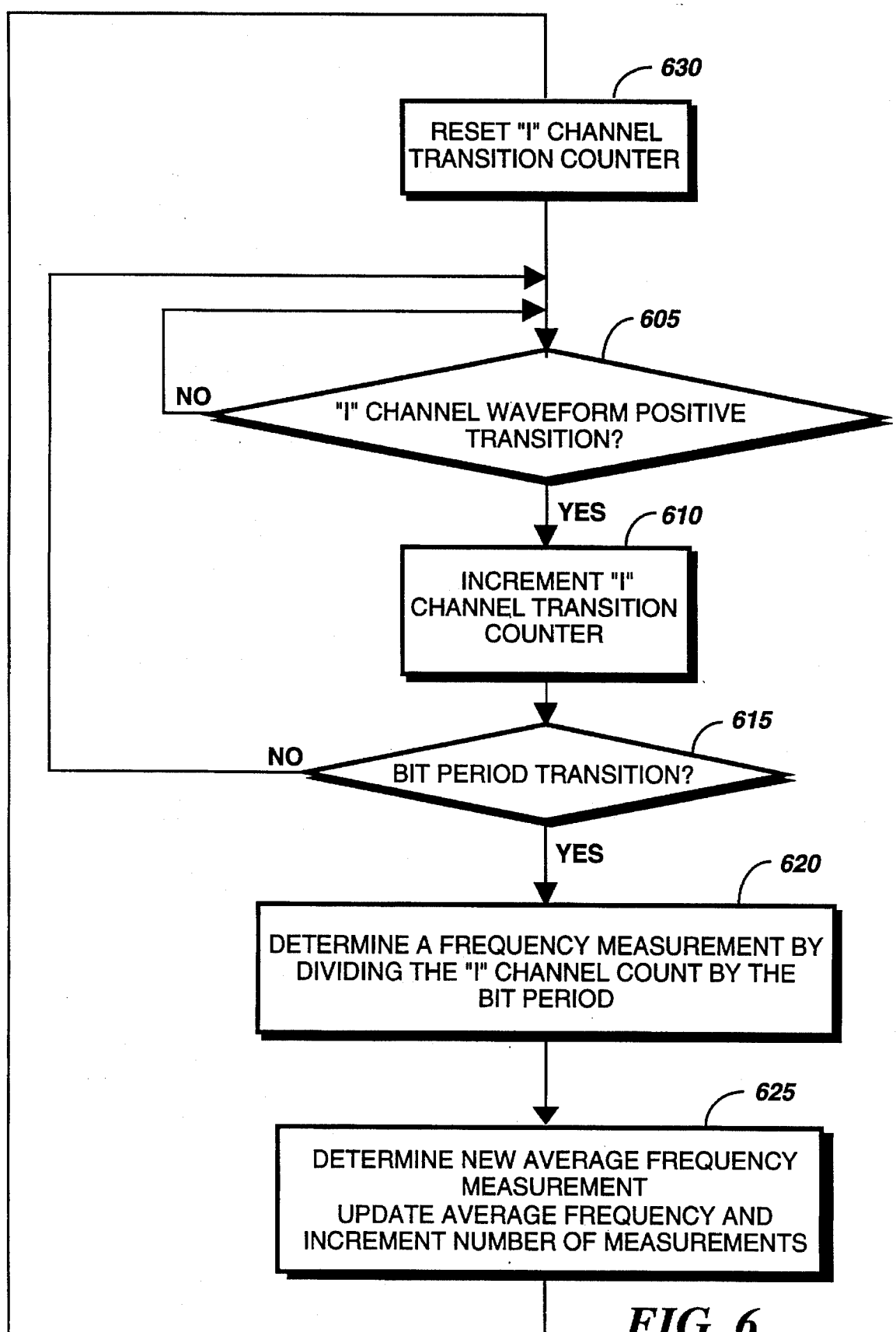
FIG. 6 shows a flow chart which illustrates a method for making frequency measurements, for use in the personal radiotelephone and the portable receiving devices of FIG. 2, and FIG. 3, in accordance with the preferred embodiment of the present invention.

Referring to FIG. 6, a flow chart is shown which illustrates the method for making frequency measurements in accordance with the preferred embodiment of the present invention. At step 630, the transition counter is reset to zero. At step 605, a positive transition of the I channel signal is awaited. When a positive transition of the I channel signal is detected, at step 605, the transition counter is incremented by one, at step 610. A flag is checked, at step 615, to determine whether a bit period transition has occurred since the previous I channel positive transition. When a bit period has not occurred, the process flow is continued at step 605, awaiting the next positive transition of the I channel clock. When a bit period transition has occurred, a frequency measurement is determined by dividing the channel transition counter by the clock period, at step 620. The frequency measurement is used to update one of the two average frequencies stored, at step 625, as either a first frequency measurement or a second frequency measurement, as determined by the associated bit state (e.g., a one or a zero), the prior average stored, and the number of associated measurements stored in frequency counter memory 439. The number of measurements associated with the average frequency is updated by one. The process flow continues at step 630.

By now it should be appreciated that there has been provided a unique method and apparatus for measuring an undesirable offset between the receive frequency and the local oscillator frequency in a radio receiver, and for determining when frequency control signal corrective changes are to be implemented in the radio receiver. The method and apparatus optimizes the timing of the measurements and changes to substantially eliminate jitters which would otherwise be induced when no signal is being received. The method and apparatus further substantially eliminates false corrections during the receipt of a signal not intended for a receiving device, and substantially eliminates extraneous errors during the reception of a signal intended for the radio receiving device. The method and apparatus automatically controls the frequency of the local oscillator signal in a quadrature or superheterodyne receiver to generate a converted signal having substantially no frequency offset error.

We claim:

1. An automatic frequency control method, for use in a radio frequency (RF) communication device which processes a received, frequency modulated (FM) RF signal having binary message information comprising at least a synchronizing portion, the radio frequency (RF) communication device comprising a receiver, a demodulator, and a local oscillator having a controllable output frequency controlled by a frequency control signal for providing reference signals for converting the received RF signal to a converted signal, said automatic frequency control method comprising the steps of:

converting the received RF signal into the converted signal;

demodulating the converted signal to generate the binary message information represented by binary states;

recovering, from the converted signal, a bit clock indicating bit periods within the binary message information generated in said step of demodulating;

generating a synchronization command signal when the synchronization portion of the binary message information correlates to a predetermined synchronization pattern;

measuring the frequency of the converted signal and further determining the associated binary state of the binary message information, for each of a plurality of the bit periods indicated by the bit clock recovered in said step of recovering; and modifying the frequency control signal in response to the synchronization command signal being generated, the modified frequency control signal being determined by the measured converted frequencies and the associated binary states.

2. The method according to claim 1 wherein the RF communication device operates in a normal power mode and a low power mode, and wherein said step of modifying is further in response to the RF communication device being in the low power mode.

3. The method according to claim 1, wherein the binary message information further comprises an address portion, and said method further comprises the step of generating an address detect signal when the address portion of the binary message information matches a stored address, wherein said modifying step is further in response to the synchronization command signal being generated and the address detect signal being generated.

4. The method according to claim 3, wherein the RF communication device operates in a normal power mode and a low power mode, and wherein said step of modifying is further in response to the RF communication device being in the low power mode.

5. The method according to claim 4, wherein the RF communication device operates in a normal power mode and a low power mode, and wherein said step of modifying is further in response to the RF communication device being in the low power mode when the modifying signal exceeds a predetermined minimum value.

6. The method according to claim 1, wherein said step of measuring the frequency of the converted signal further comprises the step of:

deriving an average offset frequency for the plurality of bit periods determined from the plurality of frequency measurements and associated binary states; and wherein in said step of modifying the frequency control signal, the modified control signal is determined from the average offset frequency.

7. The method according to claim 6, wherein said step of measuring the frequency of the converted signal further comprises the step of:

storing the frequency measurements and associated binary states in a time sequence; and wherein said step of deriving the average offset frequency, the plurality of frequency measurements and associated binary states is a predetermined number of most recently stored frequency measurements and associated binary states.

8. The method according to claim 1, wherein the receiver is a zero IF quadrature receiver, and wherein said step of measuring the frequency of the converted signal further comprises the steps of:

deriving a first average frequency from the frequency measurements associated with the first binary state and a second average frequency from the frequency measurements associated with the second binary state;

deriving a magnitude of an average offset frequency from one half the difference of the first and second average frequencies;

deriving a sign of an average offset frequency from the binary state associated with the larger of the first and second average frequencies; and wherein in said step of modifying the frequency control signal, the modified frequency control signal is determined by the sign and magnitude of the average offset frequency.

9. The method according to claim 8 wherein said step of deriving the magnitude of the average offset frequency, the magnitude of the average offset frequency is limited to a predetermined maximum amount.

10. The method according to claim 1, wherein said step of measuring the frequency of the converted signal further comprises the steps of:

deriving a first average frequency from the frequency measurements associated with the first binary state and a second average frequency from the frequency measurements associated with the second binary state;

deriving a first average deviation magnitude from a first difference between the first average frequency and a nominal intermediate frequency, and a second average deviation magnitude from a second difference between the second average frequency and the nominal intermediate frequency;

deriving a magnitude of an average offset frequency from the difference of the first and second average deviation magnitudes;

deriving a sign of an average offset frequency from the binary state associated with the larger of the first and second average deviation magnitudes; and wherein in said step of modifying the frequency control signal, the modified frequency control signal is determined by the sign and magnitude of the average offset frequency.

11. The method according to claim 10 wherein said step of deriving the magnitude of the average offset frequency, the magnitude of the average offset frequency is limited to a predetermined maximum amount.

12. A radio frequency (RF) communication device for processing a received, frequency modulated (FM) RF signal having binary message information, the binary message information comprising at least a synchronizing portion, the RF communication device comprising:

a receiver for receiving the RF signal and converting the received RF signal into a converted signal;

a demodulator, coupled to said receiver, for generating the binary message information represented by binary states;

bit clock generating means for generating a bit clock indicating bit periods within the binary information;

synchronization correlating means, coupled to said demodulator, for generating a synchronization command signal when the synchronization portion of the binary information correlates to a predetermined synchronization pattern;

a frequency counter, coupled to said receiver and said bit clock generating means, for measuring the frequency of the converted signal and further for determining the associated binary state of the binary message information for each of a plurality of the bit periods indicated by the bit clock generated by the bit clock generating means;

measurement storage means for storing the converted signal frequency measurements;

a frequency control generator, coupled to said measurement storage means and said synchronization correlating means, for generating a frequency control signal in response to the synchronization command signal being generated, the frequency control signal generated being a function of the stored converted signal frequency measurements and the associated binary states; and a controllable local oscillator, coupled to said frequency control generator and to said receiver, for supplying a local oscillator signal to the receiver, the local oscillator signal having a frequency being controlled by the frequency control signal.

13. The RF communication device according to claim 12, wherein the binary information is represented by bits having a first and second binary state, wherein said frequency counter further comprises frequency averaging means for generating a first average of the stored frequency measurements having measurements associated the first binary state and a second average of the stored frequency measurements having measurements associated the second binary states, and wherein said frequency control generator modifies the frequency control signal based on the first and second averages of the stored frequency measurements.

14. The RF communication device according to claim 12 wherein the frequency control generator generates a binary frequency control signal comprising binary information corresponding to an analog magnitude and sign of the frequency control signal, and the RF communication device further comprises a digital to analog converter, coupled to said frequency control generator and said controllable local oscillator, for generating the frequency control signal based on the binary frequency control signal.

15. The RF communication device according to claim 12 wherein the receiver is a zero intermediate frequency (IF) quadrature receiver and the converted signal comprises two orthogonal channel signals.

16. The RF communication device according to claim 12 wherein the receiver is a superheterodyne receiver and the converted signal comprises an intermediate frequency signal.

17. The RF communication device according to claim 12 wherein the binary message information further comprises an address portion, and wherein said RF communication device further comprises an address detector, coupled to said demodulator and said frequency control generator, for generating an address detection signal when the address portion of the binary message information matches a predetermined address, and wherein the frequency control generator modifies the frequency control signal in response to the generation of the synchronization command signal and the detection of the address.

18. The RF communication device according to claim 12 wherein the RF communication device further comprises a power mode control, coupled to said frequency control generator, for generating a power control signal providing a low power and normal power state to said receiver, and wherein said frequency control generator modifies the frequency control signal further in response to the power mode control being in the low power state.

19. A selective call radio frequency (RF) communication device for processing a received, frequency modulated (FM) RF signal having binary message information, the binary message information comprising at least a synchronizing portion, an address portion, and a message portion, said selective call radio frequency communication device comprising:

a receiver for receiving and converting the RF signal into a converted signal, said receiver being a zero intermediate frequency (IF) quadrature receiver, and wherein the converted signal comprises two orthogonal zero IF channel signals;

a controller coupled to said receiver, comprising:

an address memory for storing a predetermined address;

a demodulator coupled to said receiver for generating the binary message information, represented by binary states;

a bit clock generating means, coupled to said demodulator, for generating a bit clock indicating the bit periods of the binary message information;

synchronization correlating means, coupled to said demodulator, for generating a synchronization command signal when the synchronization portion of the binary message information correlates to a predetermined synchronization pattern;

an address detector, coupled to said demodulator and said bit clock generating means, for generating an address detection signal when the address portion of the binary message information matches a predetermined address;

an alert device for indicating the receipt of the binary message information in response to the address being detected;

a frequency counter, coupled to said receiver and said bit clock generating means, for measuring the frequency of the converted signal and further for determining the associated binary state of the binary message information for each of a plurality of the bit periods indicated by the bit clock generated by said bit clock generating means;

measurement storage means, coupled to said frequency counter, for storing the converted signal frequency measurements; and a frequency control generator, coupled to said measurement storage means and said synchronization correlating means, for generating a frequency control signal in response to the synchronization command signal being generated, the frequency control signal generated being a function of the stored converted signal frequency measurements and the associated binary states; and a controllable local oscillator coupled to said frequency control generator and to said receiver, for supplying a local oscillator signal to said receiver, the local oscillator signal having a frequency controlled by the frequency control signal.

\* \* \* \* \*